(12) United States Patent
Fang

(10) Patent No.: US 8,861,203 B2
(45) Date of Patent: Oct. 14, 2014

(54) ADJUSTABLE HEAT SINK ASSEMBLY

(75) Inventor: Chih-Liang Fang, New Taipei (TW)

(73) Assignee: Adlink Technology Inc., New Taipei (TW)

( * ) Notice: Subject to any disclaimer, the term of this patent is extended or adjusted under 35 U.S.C. 154(b) by 278 days.

(21) Appl. No.: 13/599,433

(22) Filed: Aug. 30, 2012

(65) Prior Publication Data

US 2014/0063731 A1    Mar. 6, 2014

(51) Int. Cl.
*H05K 7/20* (2006.01)
*H01L 23/34* (2006.01)

(52) U.S. Cl.
USPC ........... 361/719; 361/700; 361/704; 361/709; 165/80.2; 165/185; 257/718; 257/719

(58) Field of Classification Search
USPC ............... 361/679.53–679.54, 700, 709–710, 361/719; 165/80.2, 185; 257/713, 718–719
See application file for complete search history.

(56) References Cited

U.S. PATENT DOCUMENTS

| | | | |
|---|---|---|---|
| 7,019,974 B2 * | 3/2006 | Lee et al. | 361/700 |
| 7,327,576 B2 * | 2/2008 | Lee et al. | 361/719 |
| 7,382,047 B2 * | 6/2008 | Chen et al. | 257/706 |
| 7,515,423 B2 * | 4/2009 | Peng et al. | 361/710 |
| 7,548,426 B2 * | 6/2009 | Liu | 361/700 |

* cited by examiner

*Primary Examiner* — Robert J Hoffberg
(74) *Attorney, Agent, or Firm* — Muncy, Geissler, Olds & Lowe, P.C.

(57) ABSTRACT

An adjustable heat sink assembly includes a thermo-conductive bottom panel having a flat contact face protruded from the bottom wall thereof, elevation-adjustment fasteners mounted in the thermo-conductive bottom panels and fastened to a circuit board and vertically adjusted to keep the flat contact face in positive contact with a heat source at the circuit board, a thermo-conductive top panel, pitch-adjustment fasteners joining the thermo-conductive bottom panel and the thermo-conductive top panel and adjustable to control the distance between the thermo-conductive bottom panel and the thermo-conductive top panel and to keep the thermo-conductive top panel in positive contact with the housing, face panel or radiation fin of the electronic apparatus using the circuit board, and heat pipes connected between the thermo-conductive bottom panel and the thermo-conductive top panel.

7 Claims, 10 Drawing Sheets

ADJUSTABLE HEAT SINK ASSEMBLY

BACKGROUND OF THE INVENTION

1. Field of the Invention

The present invention relates to heat sink technology and more particularly, to an adjustable heat sink assembly, which comprises a heat-sink base formed of a thermo-conductive bottom panel, a thermo-conductive top panel and a plurality of heat pipes, a plurality of elevation-adjustment fasteners adapted to fasten the heat-sink base to a circuit board and adjustable to keep the thermo-conductive bottom panel in positive contact with a heat source at the circuit board, and a plurality of pitch-adjustment joining the thermo-conductive bottom panel and thermo-conductive top panel of the heat-sink base and adjustable to change the pitch between the thermo-conductive bottom panel and the thereto-conductive top panel and to keep the thermo-conductive top panel in positive contact with an external thermo-conductive object.

2. Description of the Related Art

Following fast development of computer technology, powerful, high-speed, inexpensive computers and related products with large capacities (such as desk computer, notebook computer, tablet PC, PDA, etc.) have been continuously created. In consequence, computer related applications have also been well developed. As clock frequencies in digital circuits and voltage applied increase, the heat generated by components running at the higher performance levels also increases. It requires more cooling to avoid damaging the hardware by overheating. Many heat sinks have been created for the purposes of cooling computer components (such as CPU, microprocessor, chip, monolithic chip, etc). However, due to limited internal space, an electronic apparatus may have no extra space for accommodating a cooling fan for cooling electronic components. In this case, the applied heat sink may be directly bonded to the inside of the housing of the electronic apparatus and kept in contact with the heat source at the circuit board. Alternatively, aluminum or copper columns may be connected between the circuit board and housing of an electronic apparatus for transferring waste heat from the circuit board to the housing of the electronic apparatus. In actual practice, conventional methods have drawbacks as follows:

1. The use of aluminum or copper columns as thermo-conductive media between the circuit board and the housing of the electronic apparatus greatly increases the weight of the electronic apparatus. Further, the aluminum or copper columns are not shock absorptive, and the electronic apparatus and/or its internal components may be damaged easily upon an impact.
2. Setting aluminum or copper columns as thermo-conductive media between the circuit board and the housing of the electronic apparatus causes the presence of a gap between the circuit board and the housing of the electronic apparatus, and waste heat can easily be accumulated in this gap.
3. The precision of the size of the aluminum or copper columns is critical, and a size deviation may complicate the installation between the circuit board and the housing, affecting quality control and lowering product reliability.

Therefore, it is desirable to provide a cooling design for electronic apparatus that eliminates the problems.

SUMMARY OF THE INVENTION

The present invention has been accomplished under the circumstances in view. It is one object of the present invention to provide an adjustable heat sink assembly, which can be fastened to a circuit board and adjusted to keep a heat-sink base thereof in positive contact between a heat source at the circuit board and an external thermo-conductive object for rapid heat dissipation.

To achieve this and other objects of the present invention, an adjustable heat sink assembly comprises a heat-sink base formed of a thermo-conductive bottom panel, a thermo-conductive top panel and a plurality of heat pipes, a plurality of elevation-adjustment fasteners adapted to fasten the heat-sink base to a circuit board and adjustable to keep the thermo-conductive bottom panel in positive contact with a heat source at the circuit board, and a plurality of pitch-adjustment joining the thermo-conductive bottom panel and thermo-conductive top panel of the heat-sink base and adjustable to change the pitch between the thermo-conductive bottom panel and the thermo-conductive top panel and to keep the thermo-conductive top panel in positive contact with an external thermo-conductive object.

Thus, the thermo-conductive bottom panel and thermo-conductive top panel of the heat-sink base are respectively kept in positive contact with the heat source at the circuit board and the external thermo-conductive object, and the heat pipes are connected between the thermo-conductive bottom panel and thermo-conductive top panel, and therefore, waste heat can be rapidly transferred from the heat source to the external thermo-conductive object for rapid dissipation.

Further, by means of adjusting the elevation-adjustment fasteners and the pitch-adjustment fasteners, the elevation of the heat-sink base relative to the circuit board and the pitch between thermo-conductive bottom panel and thermo-conductive top panel can be respectively adjusted, keeping the thermo-conductive bottom panel and the thermo-conductive top panel in positive contact with the heat source and the external thermo-conductive object respectively, enhancing rapid heat dissipation.

By means of the elevation-adjustment fasteners and the pitch-adjustment fasteners to adjust the elevation of the heat-sink base and the pitch between thermo-conductive bottom panel and thermo-conductive top panel, the adjustable heat sink assembly fits different application requirements and is free from the constraint of the sizes of the heat source and the external thermo-conductive object, facilitating quick installation and assuring a high level of stability and contact tightness. Further, the external thermo-conductive object can be a housing, face panel or radiation fin of an electronic apparatus (such as, notebook computer, tablet PC, electronic dictionary, PDA) using the circuit board.

Other advantages and features of the present invention will be fully understood by reference to the following specification in conjunction with the accompanying drawings, in which like reference signs denote like components of structure.

DETAILED DESCRIPTION OF THE PREFERRED EMBODIMENT

Figure 1:
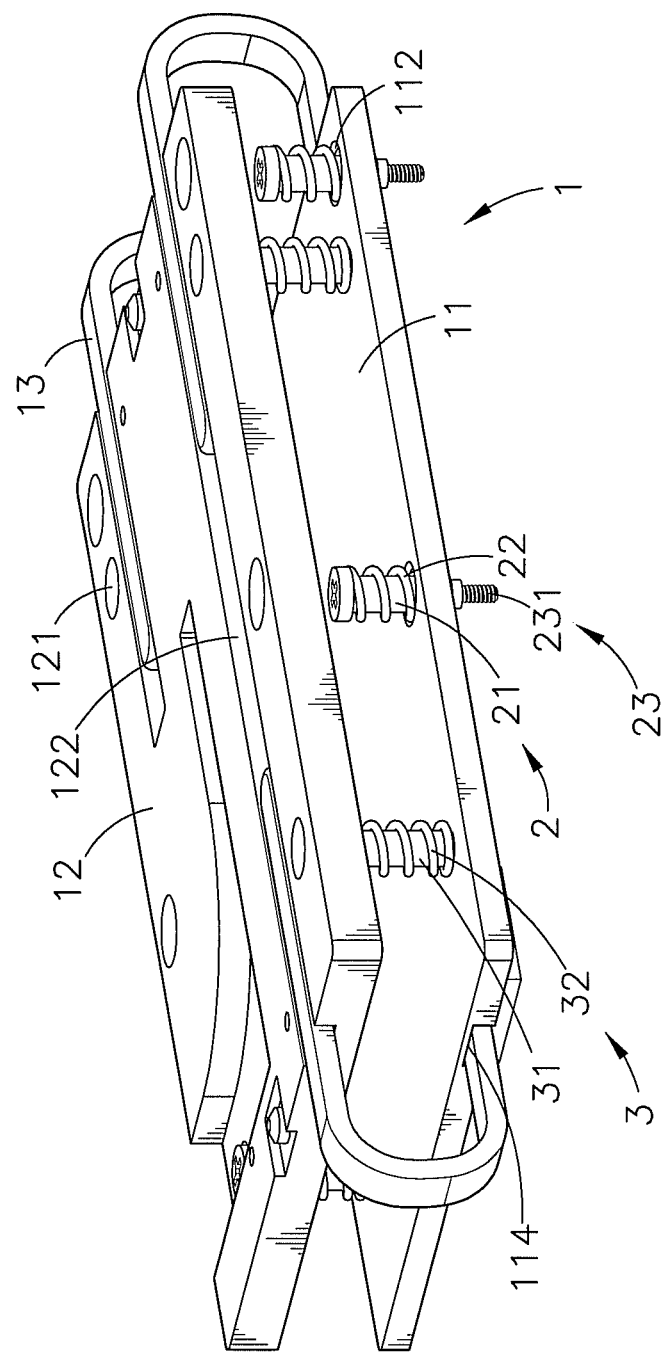
FIG. 1 is an oblique top elevation of an adjustable heat sink assembly in accordance with the present invention.
Figure 2:
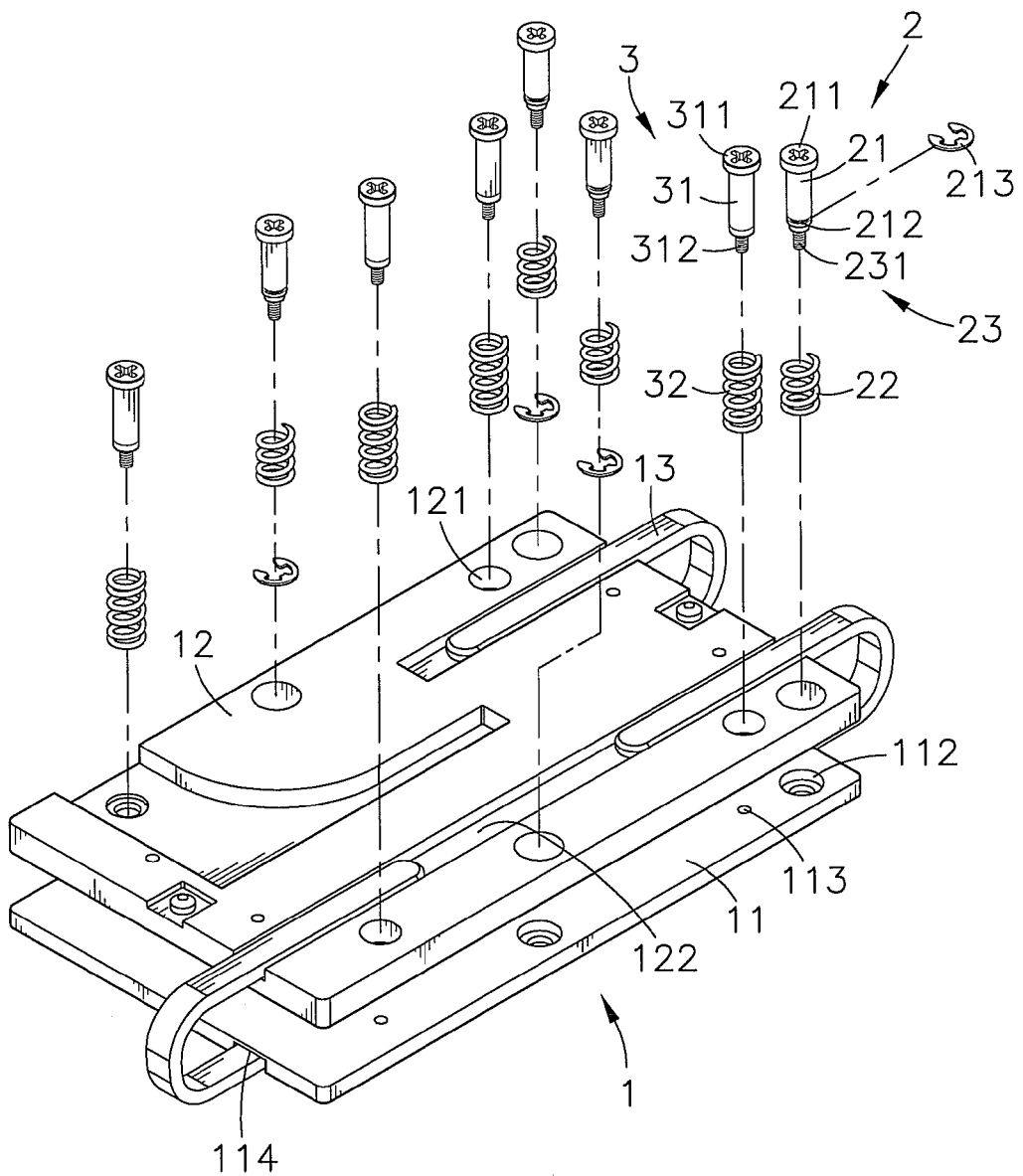
FIG. 2 is an exploded view of the adjustable heat sink assembly in accordance with the present invention.
Figure 3:
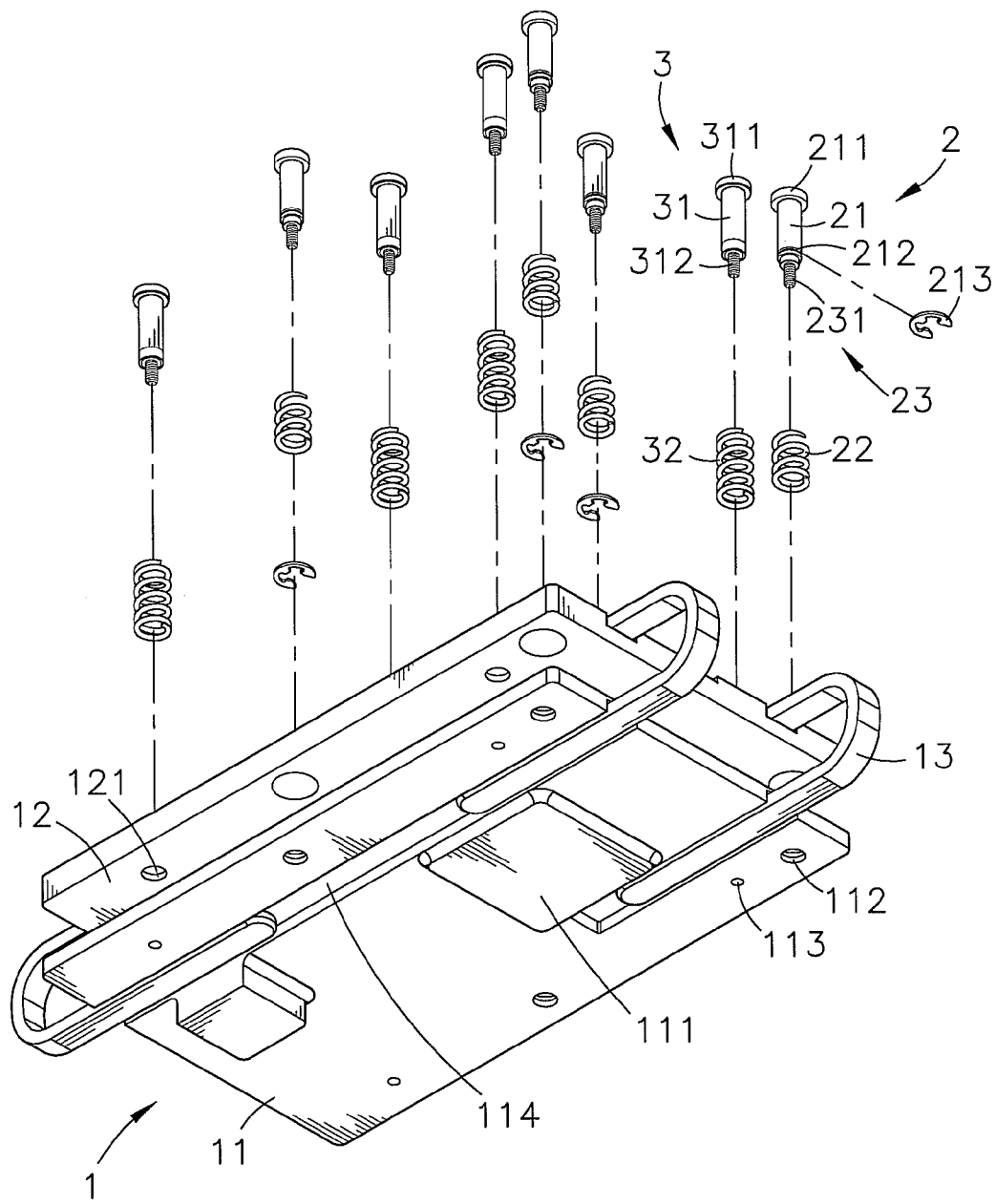
FIG. 3 corresponds to FIG. 2 when viewed from another angle.
Figure 4:
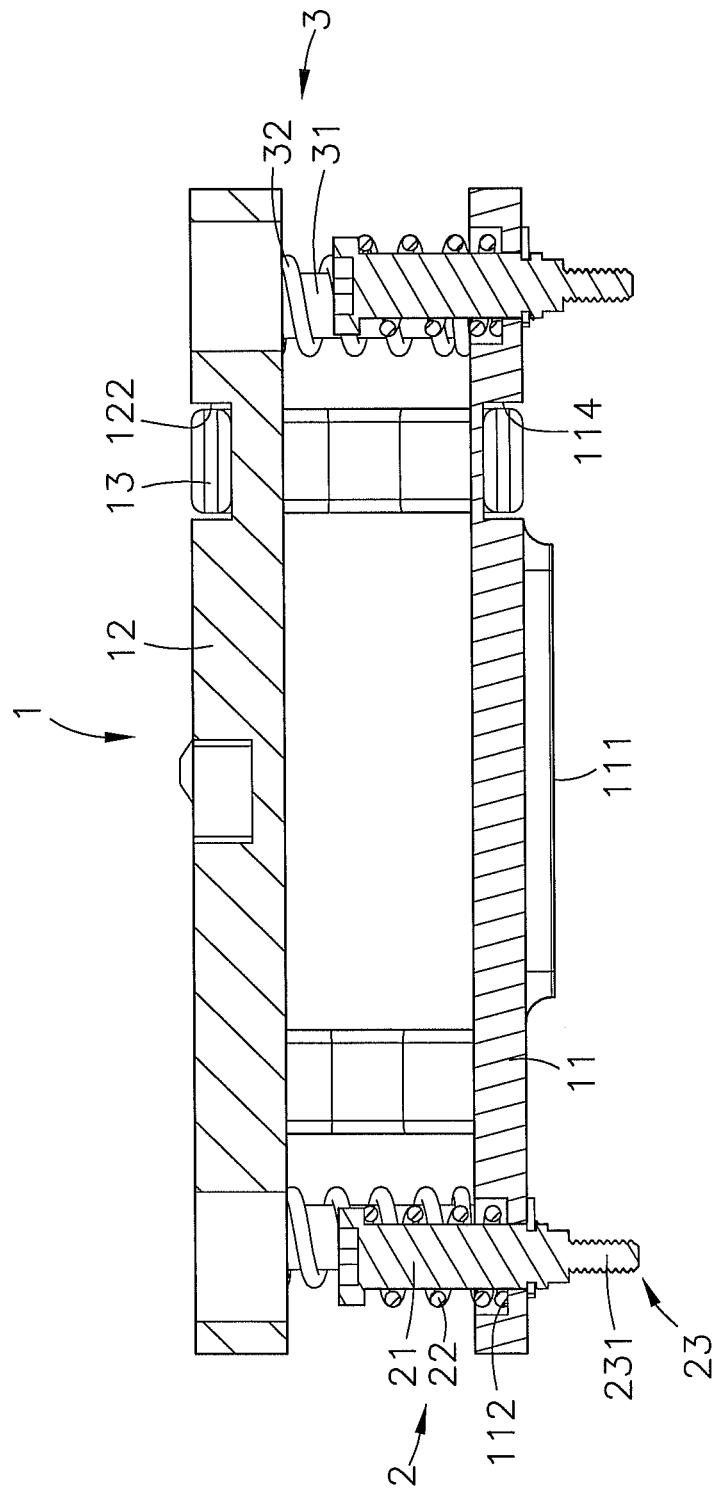
FIG. 4 is a sectional side view of the adjustable heat sink assembly in accordance with the present invention.
Figure 5:
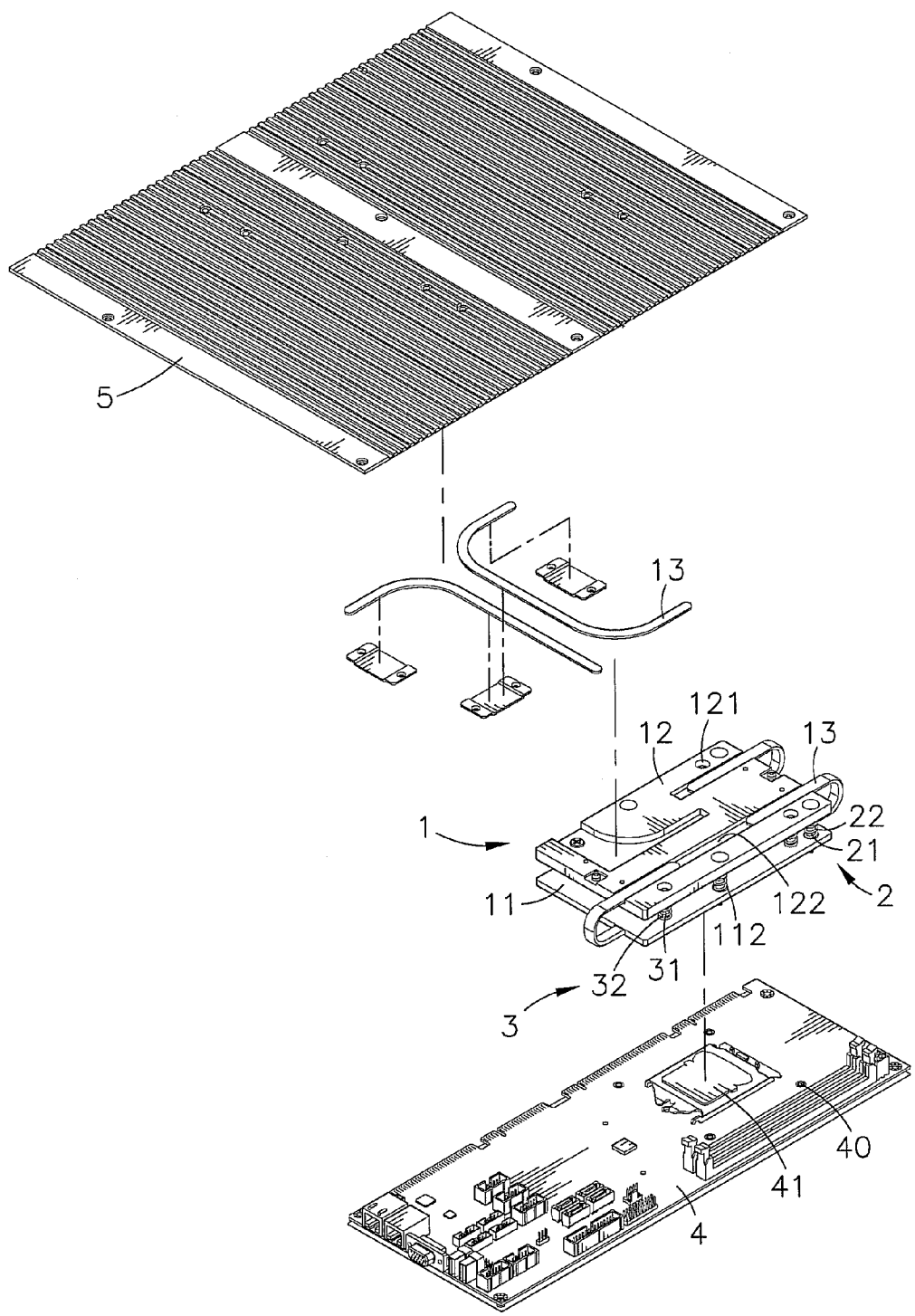
FIG. 5 is an exploded view of the adjustable heat sink assembly, an external thereto-conductive object, and an external circuit board in accordance with the present invention.
Figure 6:
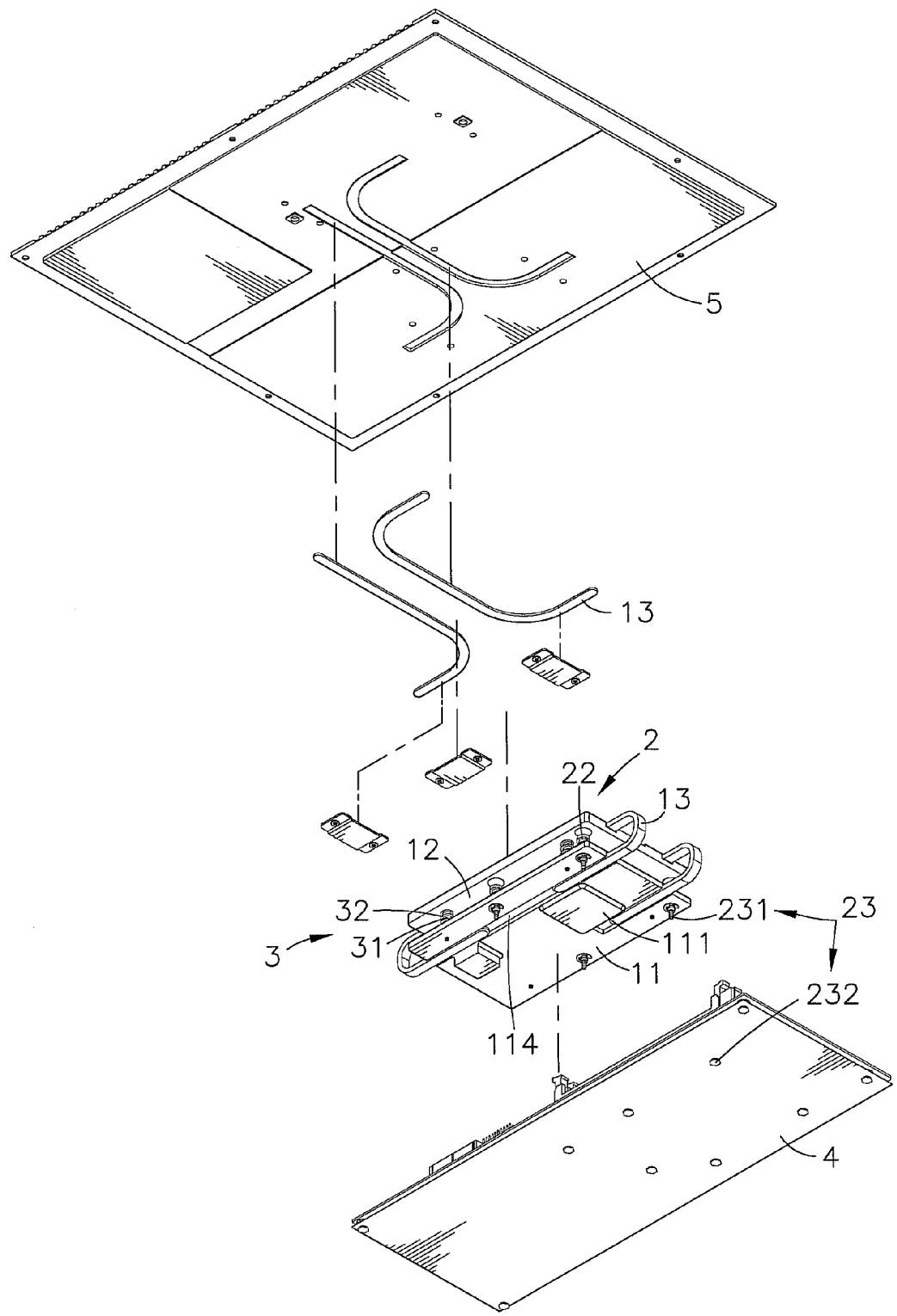
FIG. 6 corresponds to FIG. 5 when viewed from another angle.
Figure 7:
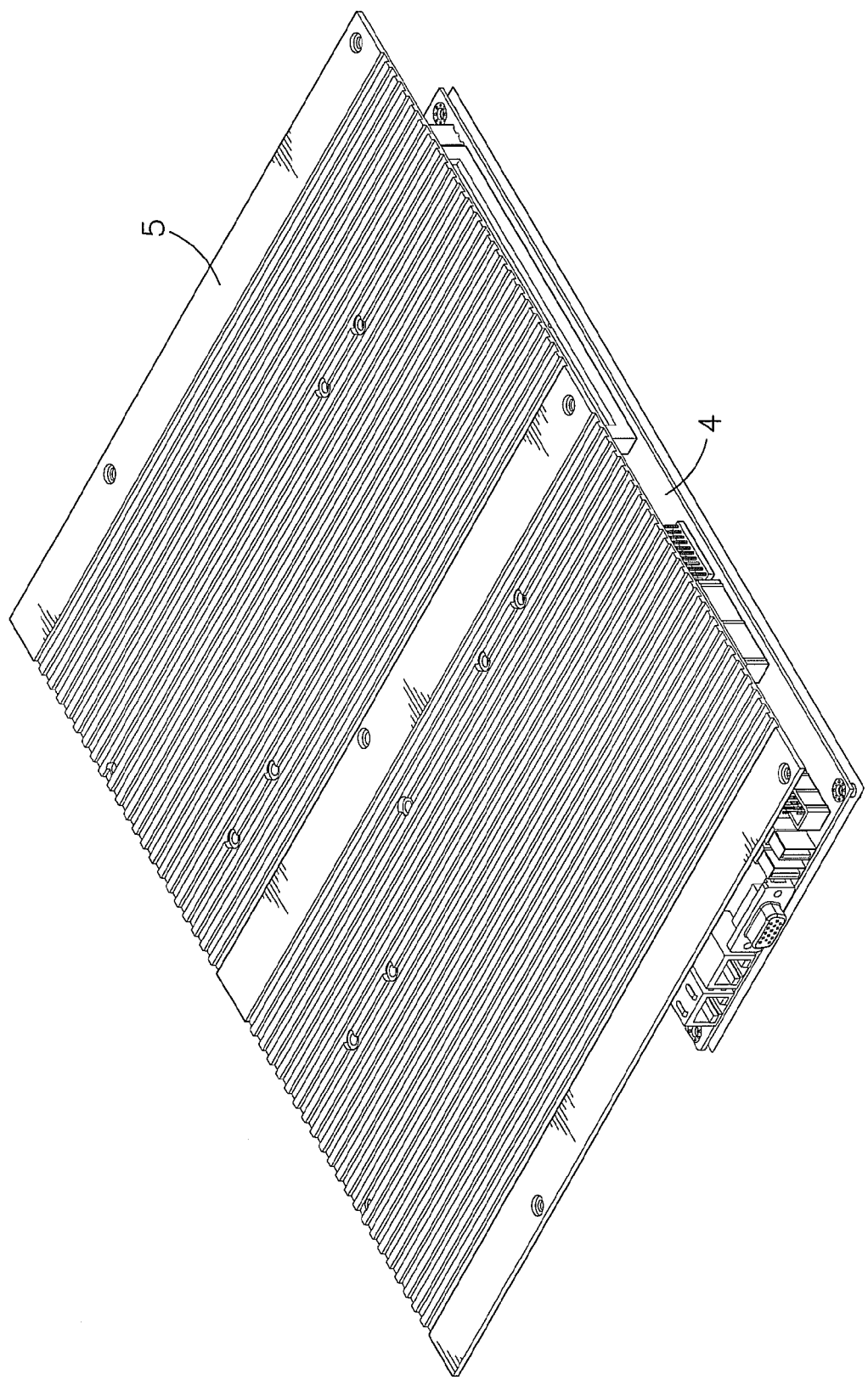
FIG. 7 is an elevational assembly view of the adjustable heat sink assembly, the external thermo-conductive object and the external circuit board shown in FIG. 5.
Figure 8:
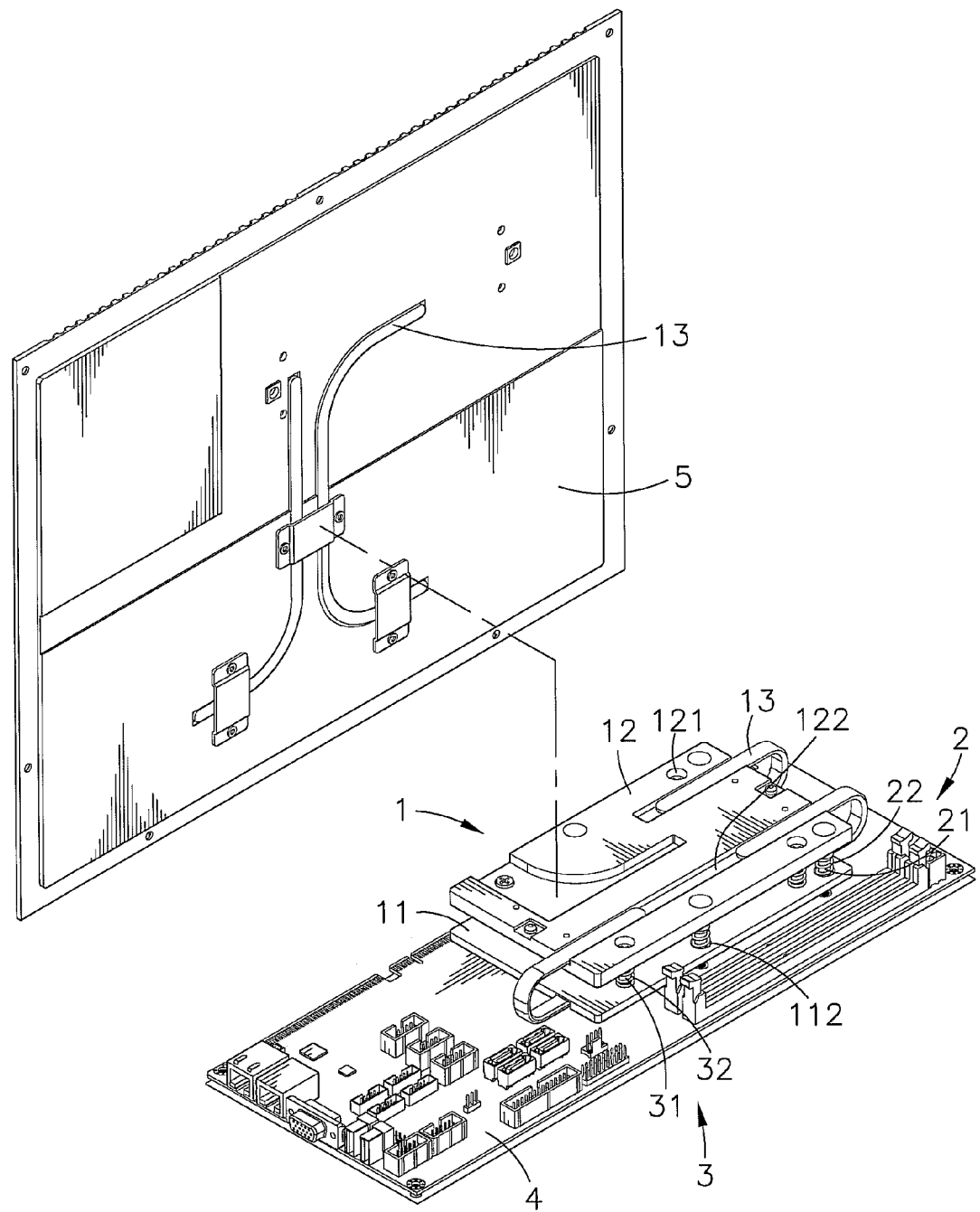
FIG. 8 corresponds to FIG. 5, illustrating the adjustable heat sink assembly installed in the external circuit board.

Referring to FIGS. 1-4, an adjustable heat sink assembly in accordance with the present invention is shown comprising a heat-sink base 1, a plurality of elevation-adjustment fasteners 2, and a plurality of pitch-adjustment fasteners 3.

The heat-sink base 1 comprises a thermo-conductive bottom panel 11, a thermo-conductive top panel 12, and a plurality of heat pipes 13. The thermo-conductive bottom panel 11 comprises at least one flat contact face 111 protruded from the bottom wall thereof, a plurality of countersunk holes 112 and screw holes 113 extending through the opposing top and bottom walls thereof and disposed at selected locations, and a plurality of locating grooves 114 located on the bottom wall thereof beyond the at least one contact face 111. The thermo-conductive top panel 12 comprises a plurality of mounting holes 121 extending through the opposing top and bottom walls thereof and respectively disposed corresponding to the screw holes 113 of the thermo-conductive bottom panel 11, and a plurality of locating grooves 122 located on the top wall thereof. The heat pipes 13 are attached to the thermo-conductive bottom panel 11 and the thermo-conductive top panel 12 with the respective two opposite ends thereof respectively positioned in the locating grooves 114 of the thermo-conductive bottom panel 11 and the locating grooves 122 of the thermo-conductive top panel 12.

Figure 9:
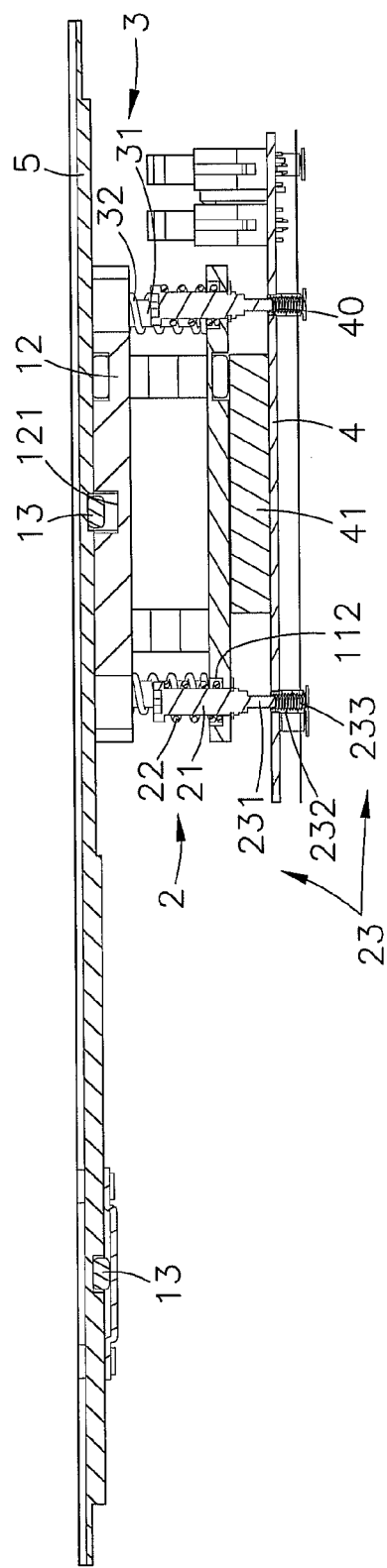
FIG. 9 is a sectional side view of FIG. 7.
Figure 10:
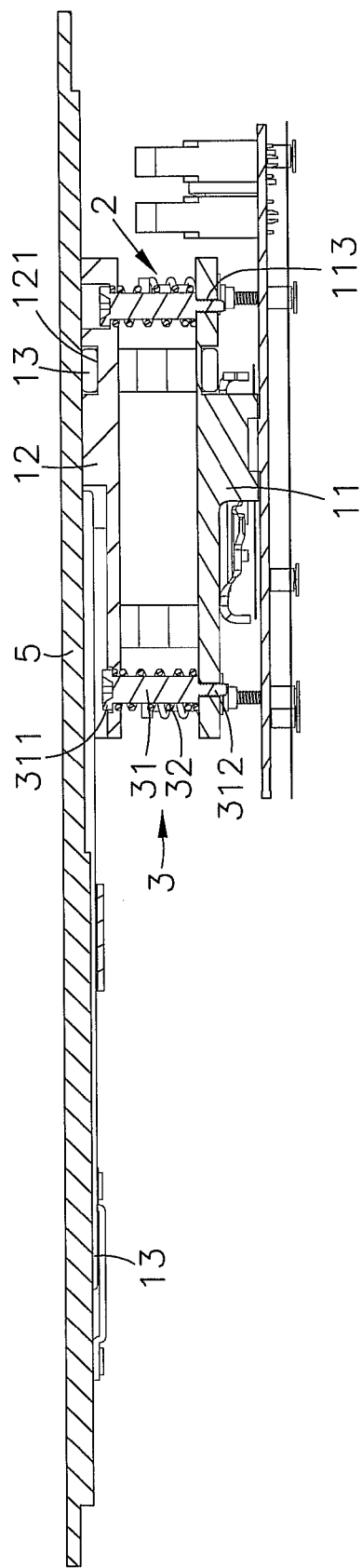
FIG. 10 corresponds to FIG. 9 when viewed from an opposite side.

Each elevation-adjustment fastener 2 comprises an adjustment bolt 21 defining a head 211 at the top end thereof and a retaining groove 212 extending around the periphery (of the shank body thereof) near the bottom end thereof remote from the head 211, a C-shaped retainer 213 fastened to the retaining groove 212 of the adjustment bolt 21, an elastic support member 22, and a length-adjustable mating connection means 23, which comprises a screw rod 231 axially downwardly extended from the bottom end of the adjustment bolt 212 and a column 232 defining therein a threaded hole 233 that is threaded onto the screw rod 231 (see also FIG. 9).

Each pitch-adjustment fastener 3 comprises an adjustment bolt 31, which comprises a head 311 at the top end thereof and a screw rod 312 at the bottom end thereof, and an elastic support member 32 sleeved onto the adjustment bolt 31 and stopped at the head 311.

When assembling the adjustable heat sink assembly, insert the adjustment bolts 21 of the elevation-adjustment fasteners 2 through the respective elastic support members 22 and the countersunk holes 112 of the thermo-conductive bottom panel 11 of the heat-sink base 1, and then fasten the C-shaped retainers 213 of the elevation-adjustment fasteners 2 to the retaining grooves 212 of the respective adjustment bolts 21 to let the C-shaped retainers 213 be stopped at the bottom wall of the thermo-conductive bottom panel 11 of the heat-sink base 1, and then insert the adjustment bolts 31 of the pitch-adjustment fasteners 3 through the mounting holes 121 of the thermo-conductive top panel 12 of the heat-sink base 1 and the respective elastic support members 32 and then thread the screw rods 312 of the adjustment bolts 31 into the screw holes 113 of the thermo-conductive bottom panel 11 of the heat-sink base 1 respectively. At this time, the user can rotate the adjustment bolts 31 of the pitch-adjustment fasteners 3 relative to the screw holes 113 of the thermo-conductive bottom panel 11 of the heat-sink base 1 to adjust the pitch between the thermo-conductive top panel 12 and the thermo-conductive bottom panel 11.

Further, the thermo-conductive bottom panel 11 and thermo-conductive top panel 12 of the heat-sink base 1 can be made of copper, aluminum, tin, or their alloys. Further, the heat pipes 13 can be made having a substantially U-shaped, L-shaped or inverted U-shaped profile and secured to the locating grooves 114 of the thermo-conductive top panel 11 and/or the locating grooves 124 of the thermo-conductive top panel 12.

Further, the elastic support members 22 of the elevation-adjustment fasteners 2 and the elastic support members 32 of the pitch-adjustment fasteners 3 can be compression springs or spring leaves able to return to their former shape after being pressed.

Referring to FIGS. 5-10 and FIGS. 2 and 3 again, an application example of the adjustable heat sink assembly in accordance with the present invention is shown. During this application, bond the columns 232 of the length-adjustable mating connection means 23 of the elevation-adjustment fasteners 2 to respective mounting holes 40 of a circuit board 4 around a heat source 41, and then attach the at least one contact face 111 of the thermo-conductive bottom panel 11 of the heat-sink base 1 of the adjustable heat sink assembly to a heat source 41 of a circuit board 4, and then thread the screw rods 231 of the length-adjustable mating connection means 23 of the elevation-adjustment fasteners 2 into the respective threaded holes 233 of the columns 232 to secure the adjustable heat sink assembly to the circuit board 4. Subject to the effect of the elastic support members 22 of the elevation-adjustment fasteners 2 and by means of rotating the screw rods 231 of the length-adjustable mating connection means 23 of the elevation-adjustment fasteners 2 relative to the respective columns 232 at the circuit board 4, the elevation of the thermo-conductive bottom panel 11 of the heat-sink base 1 of the adjustable heat sink assembly is adjusted relative to the circuit board 4, keeping the at least one contact face 111 of the thermo-conductive bottom panel 11 of the heat-sink base 1 of the adjustable heat sink assembly in positive contact with the heat source 41 of the circuit board 4 for quick transfer of waste heat from the heat source 41 of the circuit board 4 to the heat-sink base 1 and heat pipes 13 of the adjustable heat sink assembly for quick dissipation. Further, the heat source 41 of the circuit board 4 can be a CPU, microprocessor, chip, monolithic chip, or any of a variety of other electronic components.

Further, after installation of the adjustable heat sink assembly in the circuit board 4, the user can rotate the adjustment bolts 31 of the pitch-adjustment fasteners 3 relative to the screw holes 113 of the thermo-conductive bottom panel 11 of the heat-sink base 1 to adjust the pitch between the thermo-conductive top panel 12 and the thermo-conductive bottom panel 11, keeping the thermo-conductive top panel 12 and heat pipes 13 of the heat-sink base 1 in positive contact with an external thermo-conductive object 5 that can be a housing, panel or radiation fin of an electronic apparatus (such as, notebook computer, tablet PC, electronic dictionary, PDA) using the circuit board 4. Subject to the effect of the elastic support members 32 of the pitch-adjustment fasteners 3, the thermo-conductive top panel 12 and heat pipes 13 of the heat-sink base 1 are kept in positive contact with the external thermo-conductive object 5 against shocks, facilitating rapid heat dissipation.

As stated above, after the heat-sink base 1 of the adjustable heat sink assembly has been fastened to the circuit board 4 by the elevation-adjustment fasteners 2, the elevation-adjustment fasteners 2 can be adjusted to change the elevation of the heat-sink base 1 relative to the circuit board 4 and to keep the thermo-conductive bottom panel 11 and heat pipes 13 of the heat-sink base 1 in positive contact with the heat source 41 at the circuit board 4, and the pitch-adjustment fasteners 3 can be adjusted to change the pitch between the thermo-conductive top panel 12 and the thermo-conductive bottom panel 11 and to keep the thermo-conductive top panel 12 and the heat pipes 13 in positive contact with the external thermo-conductive object 5 that can be a housing, panel or radiation fin of an electronic apparatus (such as, notebook computer, tablet PC, electronic dictionary, PDA) using the circuit board 4.

In conclusion, the adjustable heat sink assembly of the present invention has the features and advantages as follows:

1. During application, the thermo-conductive bottom panel 11 and thermo-conductive top panel 12 of the heat-sink base 1 are respectively kept in positive contact with the heat source 41 at the circuit board 4 and the external thermo-conductive object 5, and the heat pipes 13 are connected between the thermo-conductive bottom panel 11 and thermo-conductive top panel 12, and therefore, waste heat can be rapidly transferred from the heat source 41 to the external thermo-conductive object 5 for rapid dissipation.
2. By means of adjusting the elevation-adjustment fasteners 2 and the pitch-adjustment fasteners 3, the elevation of the heat-sink base 1 relative to the circuit board 4 and the pitch between thermo-conductive bottom panel 11 and thermo-conductive top panel 12 can be respectively adjusted, keeping the thermo-conductive bottom panel 11 and the thermo-conductive top panel 12 in positive contact with the heat source 41 and the external thermo-conductive object 5 respectively, enhancing rapid heat dissipation.
3. By means of the elevation-adjustment fasteners 2 and the pitch-adjustment fasteners 3 to adjust the elevation of the heat-sink base 1 and the pitch between thermo-conductive bottom panel 11 and thermo-conductive top panel 12, the adjustable heat sink assembly fits different application requirements and is free from the constraint of the sizes of the heat source 41 and the external thermo-conductive object 5, facilitating quick installation and assuring a high level of stability and contact tightness.

Although a particular embodiment of the invention has been described in detail for purposes of illustration, various modifications and enhancements may be made without departing from the spirit and scope of the invention. Accordingly, the invention is not to be limited except as by the appended claims.

What the invention claimed is:

1. An adjustable heat sink assembly, comprising:
   a heat-sink base arranged between a circuit board and an external thermo-conductive object and adapted to transfer waste heat from a heat source disposed on said circuit board to said external thermo-conductive object for rapid waste heat dissipation, said heat sink base comprising a thermo-conductive bottom panel, a thermo-conductive top panel spaced above said thermo-conductive bottom panel in a parallel manner and a plurality of heat pipes connected between said thermo-conductive bottom panel and said thermo-conductive top panel, said thermo-conductive bottom panel comprising at least one flat contact face protruded from a bottom surface thereof and a plurality of countersunk holes and a plurality of screw holes extending through opposing top and bottom surfaces thereof, said thermo-conductive top panel comprising a plurality of mounting holes extending through opposing top and bottom surfaces thereof and respectively disposed corresponding to the screw holes of said thermo-conductive bottom panel;
   a plurality of elevation-adjustment fasteners respectively mounted in said countersunk holes of said thermo-conductive bottom panel and fastened to said circuit board and adjustable to adjust the elevation of said thermo-conductive bottom panel relative to said circuit board, each of said elevation-adjustment fasteners comprising an elevation-adjustment bolt inserted through one of said countersunk holes, said elevation-adjustment bolt comprising a head located on a top end thereof and suspending above said thermo-conductive bottom panel and a retaining groove extending around the periphery near a bottom end thereof and disposed beneath said thermo-conductive bottom panel, a C-shaped retainer fastened to said retaining groove of said elevation-adjustment bolt and stopped at the bottom surface of said thermo-conductive bottom panel, an elastic support member mounted around said elevation-adjustment bolt and stopped between the head of said elevation-adjustment bolt and thermo-conductive bottom panel, and a length-adjustable mating connection means located on the bottom end of said elevation-adjustment bolt and fastened to said circuit board and adjustable to adjust a distance between said thermo-conductive bottom panel and said circuit board; and
   a plurality of pitch-adjustment fasteners respectively mounted in said mounting holes of said thermo-conductive top panel and fastened to said screw holes of said thermo-conductive top panel and adjustable to adjust a distance between said thermo-conductive top panel and said thermo-conductive bottom panel, each of said pitch-adjustment fasteners comprising a pitch-adjustment bolt, said pitch-adjustment bolt comprising a head located on a top end thereof and mounted in one of said mounting holes and a screw rod located on a bottom end thereof and adjustably threaded into one of said screw holes of said thermo-conductive bottom panel, and an elastic support member sleeved onto said pitch-adjustment bolt and stopped between the head said pitch-adjustment bolt and said thermo-conductive bottom panel.

2. The adjustable heat sink assembly as claimed in claim 1, wherein said thermo-conductive top panel and said thermo-conductive bottom panel are selected from a material group of copper, copper alloys, aluminum, aluminum alloys, tin, and tin alloys.

3. The adjustable heat sink assembly as claimed in claim 1, wherein said thermo-conductive top panel comprises at least one locating groove located on the top surface thereof; said thermo-conductive bottom panel comprises said at least one locating groove located on the bottom surface thereof; a first end of each of said heat pipes is attached to the at least one locating groove of said thermo-conductive top panel and an opposing second end of each of said heat pipes is attached to the at least one locating groove of said thermo-conductive bottom panel.

4. The adjustable heat sink assembly as claimed in claim 1, wherein said heat pipes are configured in one of a U-shaped, a L-shaped or an inverted U-shaped profiles.

5. The adjustable heat sink assembly as claimed in claim 1, wherein said heat source is one of a CPU, a microprocessor, a chip or a monolithic chip.

6. The adjustable heat sink assembly as claimed in claim 1, wherein said external thermo-conductive object is one of a housing, a face panel or a radiation fin, and wherein said external thermo-conductive object and said circuit board are portions of an electronic apparatus.

7. The adjustable heat sink assembly as claimed in claim 1, wherein said length-adjustable mating connection means comprises a column bonded to said circuit board and defining therein a threaded hole, and a screw rod axially downwardly extended from the bottom end of the associating elevation-adjustment bolt and adjustably threaded into the threaded hole of said column.

* * * * *